(12) United States Patent
Akiyama et al.

(10) Patent No.: US 7,799,513 B2
(45) Date of Patent: Sep. 21, 2010

(54) PROCESS FOR PREVENTING DEVELOPMENT DEFECT AND COMPOSITION FOR USE IN THE SAME

(75) Inventors: Yasushi Akiyama, Shizuoka (JP); Yusuke Takano, Shizuoka (JP); Kiyohisa Takahashi, Shizuoka (JP); Sung-Eun Hong, Shizuoka (JP); Tetsuo Okayasu, Shizuoka (JP)

(73) Assignee: AZ Electronic Materials USA Corp., Somerville, NJ (US)

( * ) Notice: Subject to any disclaimer, the term of this patent is extended or adjusted under 35 U.S.C. 154(b) by 604 days.

(21) Appl. No.: 10/518,105

(22) PCT Filed: Jun. 10, 2003

(86) PCT No.: PCT/JP03/07354

§ 371 (c)(1),
(2), (4) Date: Dec. 10, 2004

(87) PCT Pub. No.: WO04/001510

PCT Pub. Date: Dec. 31, 2003

(65) Prior Publication Data

US 2005/0221236 A1    Oct. 6, 2005

(30) Foreign Application Priority Data

Jun. 21, 2002   (JP)   ............... 2002-181127

(51) Int. Cl.
G03F 7/00 (2006.01)
(52) U.S. Cl. ............... 430/322; 430/270.1; 430/311
(58) Field of Classification Search ............... 430/270.1, 430/311, 330, 331, 401, 413, 414, 406, 434; 216/41–44; 8/445; 505/413; 510/176
See application file for complete search history.

(56) References Cited

U.S. PATENT DOCUMENTS

| | | | |
|---|---|---|---|
| 4,833,067 A | 5/1989 | Tanaka et al. | |
| 5,529,888 A | 6/1996 | Watanabe et al. | |
| 5,541,037 A | 7/1996 | Hatakeyama et al. | |
| 5,698,357 A | 12/1997 | Inoue et al. | |
| 6,472,127 B1 | 10/2002 | Takizawa | |
| 6,605,417 B2 | 8/2003 | Nitta et al. | |
| 2004/0101780 A1 | 5/2004 | Maemoto | |
| 2004/0137344 A1 | 7/2004 | Yamashita et al. | |
| 2005/0100814 A1* | 5/2005 | Berger et al. | 430/270.1 |

FOREIGN PATENT DOCUMENTS

| | | |
|---|---|---|
| EP | 0 522 990 A1 | 5/1992 |
| EP | 1 306 726 A1 | 5/2003 |
| JP | 61-179435 | 8/1986 |
| JP | 2643056 | 5/1987 |
| JP | 04-51020 | 2/1992 |
| JP | 7-140668 A | 6/1995 |
| JP | 07-181685 | 7/1995 |
| JP | 8-15859 A | 1/1996 |
| JP | 8-95253 A | 4/1996 |
| JP | 09-246166 | 9/1997 |
| JP | 2000-275835 A | 10/2000 |
| JP | 2001-23893 A | 1/2001 |
| JP | 2002006514 A * | 1/2002 |

OTHER PUBLICATIONS

English language abstract (from Japanese Patent Office) of JP2001-133984, May 2001.
English language abstract (from Japanese Patent Office) of JP2002-148821, May 2002.
English language abstract (from Japanese Patent Office) of JP06-148896, May 1994.
English language abstract (from Japanese Patent Office) of JP05-326389, Dec. 1993.
English language abstract (from Japanese Patent Office) of JP2000-010294, Jan. 2000.
English language abstract (from Japanese Patent Office) of JP09-325500, Dec. 1997.
English language abstract (from Japanese Patent Office) of JP09-246166, Sep. 1997.
English language abstract (from Japanese Patent Office) of JP04-051020, Feb. 1992.

(Continued)

*Primary Examiner*—Cynthia H Kelly
*Assistant Examiner*—Chanceity N Robinson
(74) *Attorney, Agent, or Firm*—Alan P. Kass; Sangya Jain

(57) ABSTRACT

The composition for preventing development-defects containing (1) an ammonium salt, a tetraalkylammonium salt or a $C_1$ to $C_4$ alkanolamine salt of $C_4$ to $C_{15}$ perfluoroalkylcarboxylic acid, $C_4$ to $C_{10}$ perfluoroalkylsulfonic acid and perfluoroadipic acid, or (2) a fluorinated alkyl quaternary ammonium salt of inorganic acid, wherein said surfactant is formed at the equivalent ratio of acid to base of 1:1-1:3 is applied on a chemically amplified photoresist coating on a substrate having a diameter of 8 inches or more. The chemically amplified photoresist coating is baked before and/or after applying the composition for preventing development-defects described above. Then, the baked coating with the development-defect preventing composition coating is exposed to light, post-exposure-baked, and developed. By this process, compared with the case of not using the composition for preventing development-defects, the amount of reduction in film thickness of the photoresist subsequent to development treatment is made further bigger by 100 Å to 600 Å, and the development-defects on a substrate having a diameter of 8 inches or more is reduced as well as a resist pattern having a good cross section form can be formed without T-top form etc.

1 Claim, No Drawings

OTHER PUBLICATIONS

English language abstract (from Japanese Patent Office) of JP61-179435, Aug. 1996.
Machine Language English Translation from JPO of JP 5-326389 A, Nov. 2007.
English Language Abstract of JP 7-140668 A, Jun. 1995.
English Language Abstract of JP 8-15859 A, Jan. 1996.
English Language Abstract of JP 2000-10294 A, Jan. 2000.
Feely, Wayne E., "The role of the latent image in a new dual image aqueous developable, thermally stable photoresist", Polymer Engineering and Science, Mid-Sep. 1986, vol. 26, No. 16, pp. 1101-pp. 1104.
Machine Language English Translation from JPO of JP 2001-133984 A, Nov. 2007.
International Search Report (Form PCT/ISA/210) for PCT/JP01/05072 (PCT of U.S. Appl. No. 10/311,787), Sep. 2001.
Ito, Hiroshi, et al., "Chemical amplification in the design of dry developing resist materials", Polymer Engineering and Science, 1983, vol. 23, No. 18, pp. 1012-pp. 1018.
Feely, Wayne E., "The role of the latent image in a new dual image aqueous developable, thermally stable photoresist", Polymer Engineering and Science, Mid-Sep. 1986, vol. 26, No. 16, pp. 1101-pp. 1104.

\* cited by examiner

PROCESS FOR PREVENTING DEVELOPMENT DEFECT AND COMPOSITION FOR USE IN THE SAME

This application is a United States National Stage Patent Application under 35 U.S.C. §371 of International Patent Application No. PCT/JP03/07354, filed Jun. 10, 2003, which claims priority to Japanese Patent Application No. 2002-181127, filed Jun. 21, 2002, the contents of both documents being incorporated herein by reference.

TECHNICAL FIELD

This invention relates to a process for forming a resist pattern with a good profile by using a positive-working chemically amplified photoresist, and to a composition for preventing development-defects used in this process. More particularly, it relates to a process for forming a resist pattern by which a resist pattern with a good profile can be formed all over the large-diameter substrate when a resist pattern is formed by pattern-wise exposing a large-diameter substrate having formed thereon a chemically amplified photoresist coating followed by development, and to a composition for preventing development-defects used in this process.

BACKGROUND ART

In manufacturing semiconductor elements, lithographic technology has been employed in which a photoresist coating is formed on a substrate such as a silicon wafer and, after selectively irradiating the coating with actinic rays, development treatment is conducted to form a resist pattern on the substrate thereby.

In recent years, in order to attain higher degree of integration in LSI, patterning technology for forming patterns with a finer line width in a lithographic process has been making a rapid progress. For forming a pattern with a finer line width, various proposals have been made with respect to all steps of the lithography and all materials to be used therein including photoresists, antireflective coatings, exposing methods, exposing apparatus, developing agents, developing processes and developing apparatus. For example, Japanese Patent Publication No. 2,643,056 and Japanese Unexamined Patent Publication No. H7-181685 describe that an antireflective surface coating containing a fluorine-containing compound with a low refractive index is formed on a resist coating to prevent detrimental influences of reflected light from the resist surface on formation of a resist pattern thereby. When an antireflective coating is coated on a resist layer, degree of vibration amplitude of the thickness of a resist coating v.s. sensitivity curve becomes smaller. Therefore fluctuation in sensitivity of resist becomes smaller even when thickness of the resist layer fluctuates, which leads the advantage of a decreased fluctuation in dimension of resist patterns formed. In addition, the antireflective surface coating serves to decrease standing wave to be caused by interference between incident light and reflected light or between one reflected light and another reflected light. Recently, technology of forming a resist pattern having a desired line width without providing the antireflective surface coating has also been developed. As examples thereof, there are illustrated that an underlying substrate is made plane to depress fluctuation in dimension due to fluctuation in thickness of the resist layer as described above, or a mask pattern is finely adjusted in advance according to fluctuation in dimension of the resist.

With regard to exposing apparatus, there has been proposed a process of using a light source emitting radiation of a short wavelength, which is advantageous for formation of a superfiner pattern, such as deep UV rays of KrF excimer laser (248 nm) or ArF excimer laser (193 nm) or, further, X rays or electron beams, and some of them have been coming into practice.

On the other hand, improvement in the yield of semiconductor integrated circuits has been paid attention as an extremely important matter in manufacturing them. There exist many factors by which the yield of semiconductor integrated circuits is decided. One of the factors is patterning failure upon forming a pattern using a resist. This patterning failure of a resist pattern is caused, for example, by the dust existing in the resist or sticking onto the surface of the resist layer, by the deterioration of the resist due to floating chemical species in the clean room, by the coating failure of the resist or the like, or by the development failure. As an example of deterioration due to chemical species floating in a clean room, there is given a process using a chemically amplified photoresist. In this process, the chemically amplified photoresist is susceptible to influence of acidic substances, basic substances and moisture in the atmosphere. Therefore, when the period between pattern-wise exposure and PEB (post exposure bake) is prolonged (post exposure delay) or due to intermixing with a resist, there results a change in dimension of a pattern, for example, by formation of a T-topped resist pattern in the case where a positive-working photoresist is used as resist, or formation of a round-topped resist pattern in the case where a negative-working photoresist is used as resist.

In addition, defects upon developing a resist layer have become a problem. As examples of defects upon development, there are given formation of scum in line-and-space type resists and hole-opening failure in contact hole type resists. Several causes may be considered for the hole-opening failure of contact holes, but the most popular hole-opening failure is one caused by residues after development. As a cause of these defects, there is illustrated insufficient dissolution of exposed portions into a developing solution due to insufficient contact between the developing solution containing water as a major component and the surface of a resist coating upon bringing the developing solution into contact with the resist surface, which leads to hole-opening failure of portions which are designed to open essentially. It is also thought that hardly-solubles in the developing solution might re-deposit onto the surface of the resist upon rinsing with water after development.

Further, it is necessary to enhance contrast of a resist in order to form a finer pattern. In general, in order to improve contrast of a contact hole type resist, a technique of increasing a protecting ratio of hydrophilic groups in a major component polymer is used with respect to, for example, positive-working chemically amplified photoresists. However, when the protecting ratio is increased, the resist surface is liable to become hydrophobic, leading to deterioration in wetting properties for the developing solution.

Various investigations have been conducted to solve the above-described problems. For example, Japanese Unexamined Patent Publication No. H9-246166 proposes to treat the surface of a photoresist with plasma to render the surface hydrophilic thereby, thus improving wetting properties of the resist for a developing solution and decreasing development defects. This technique, however, requires introduction of an additional apparatus for the plasma treatment as well as includes the problem of decrease in throughput.

In addition, various attempts for decreasing the development defects by optimizing development sequence have been made as well. For example, Japanese Examined Patent Publication No. H4-51020 describes to improve wetting properties of a positive-working resist for a developing solution by adding an acetylenealcohol type surfactant to the developing solution, thereby forming a pattern having no development defects. Although some effects can be obtained by this technique, the effects are at present still insufficient in ultra-fine working using the aforesaid chemically amplified photoresists. In addition, Japanese Unexamined Patent Publication No. S61-179435 describes a method of optional formation of surface coating, which is effective for improving wetting properties for a developing solution, as well as a method of adding a surfactant to the developing solution and a method of plasma-treating the surface of a resist coating, for preventing development defects resulting from lack of wetting properties for the developing solution.

Particularly in the case where surface coating for decreasing the development defects is formed on a chemically amplified photoresist, there may cause a round-topped or a T-topped pattern which may cause a trouble in an etching process when a surface coating composition, which is coated to reduce this development-defect, is compatible with a chemically amplified resist. For example, in the patent publication of JP 2643056, as an anti-reflective coating composition to form an anti-reflective coating on a photoresist film, a composition comprising a water-soluble polymer binder and a water-soluble fluorocarbon compound (for example, a quaternary ammonium salt of perfluorocarboxylic acid or perfluorosulfonic acid, and so on) was disclosed. However, in said publication, there is no description of a control on the amount of reduced thickness in film thickness after developing a chemically amplified photoresist. In addition, the method described in the publication has a problem. That is, in the case where the anti-reflective coating composition described in said publication is used, when the chemically amplified photoresist is a positive-working photoresist, a pattern profile of a resist pattern formed is likely to become a T-letter-shape (T-top), and when being a negative-working photoresist, the pattern profile of the resist pattern formed is likely to become a round shape (round-top), thereby a problem of pattern dimension deterioration being taken place.

Further, it is said that problems in attaining uniform thickness of coating and uniform development to be caused with a recent increase in diameter of a substrate such as a silicon wafer make it difficult to form a finer pattern. For example, a paddle developing method has so far been popularly employed for developing a resist coating on the silicon wafer. In the paddle developing method, a developing solution is dropped onto a resist coating formed on a substrate, and the substrate is spun to form a thin film of the developing solution all over the resist coating, thus development of the resist coating being conducted. However, there generates a difference in circumferential speed between the central portion and the peripheral portion of the substrate, thereby a difference in speed of the coating generating. Thus, developing conditions become different between the central portion of the wafer and the peripheral portion thereof. In this situation, particularly when a chemically amplified photoresist is used as a resist and a developing process of a large-diameter substrate having a diameter of 8 inches or more is conducted, development defects in the peripheral portion are caused in some cases which have not conventionally been observed in treating a resist coating formed on a substrate having a diameter of 6 inches or less.

Therefore, in order to improve a yield in manufacturing semiconductor integrated circuits and so on, a process for forming a resist pattern has been desired which enables one to reduce development defects to be caused upon development including a development defect of a chemically amplified photoresist in the periphery of a larger diameter substrate such as a silicon wafer caused by increasing in diameter of a substrate, and which does not cause pattern failure such as T-top or round top after development for coping with formation of finer patterns earnestly for forming a finer resist pattern.

As a method to reduce such development defects, Japanese Unexamined Patent Publication No. 2002-6514 describes that by applying a composition for reducing a development-defect containing a fluorine-containing surfactant on a chemically amplified photoresist coating, the amount of reduced thickness in film thickness of the chemically amplified photoresist after exposure to light and development is made bigger by further 10 Å to 500 Å compared with the case without applying this composition for reducing development-defects to form a pattern without development-defect thereby. In this publication, as a surfactant which is contained in a composition for reducing development-defects of a positive-working chemical amplified photoresist, it is disclosed to use a surfactant which is formed with excess of acid for the composition ratio of organic acid and base and in which at least acid remains. However, it is difficult to make this film thickness reduction large by using the composition for reducing development-defects. When elimination of T-top can be realized in the case where film thickness reduction would be made large, there is a limit to form a pattern with good profiles by using the composition for reducing development-defects. In addition, in the publication, there is no description that a film thickness reduction can be controlled quantitatively. Because of this there is a problem that it is difficult to obtain the composition for reducing development-defects which can provide an optimal film thickness reduction in order to make the pattern-profiler rectangular and good.

In consideration of the above-described situation, an object of the present invention is to provide a process of forming a resist pattern by using a composition for preventing development defects by which development defects of a positive-working chemically amplified photoresist is particularly reduced upon developing of a large diameter substrate having a diameter of 8 inches or more and deterioration of pattern profiles does not be caused such as T-top or round top which are inconvenient for an etching step due to detrimental influences of a processing atmosphere and intermixing between the surface coating and the resist, wherein an occurrence of development defects on a substrate with large diameter and a pattern profile after development can be improved with optimal film thickness reduction by use of a composition for preventing development defects which can make a film thickness reduction after development bigger compared with the process so far known as well as control the amount of film thickness reduction, and coping with optimal film thickness reduction is easy.

Another object of the present invention is to provide a composition for preventing development-defects used in above-described process.

As a result of intensive investigations, the inventors have found that in a process of forming a resist pattern in which a composition for preventing development-defects containing a particular fluorine-containing surfactant is applied on a positive-working chemically amplified photoresist to render the surface thereof hydrophilic, then pattern-wise exposed to light and developed, the amount of film thickness reduction subsequent to a development of a positive-working chemically amplified photoresist can be enlarged when the equivalent of acid and base which constitute the surfactant is made excess of base compared with acid upon a formation of a surfactant which is contained in the composition for preventing development defects, and the amount of film thickness reduction of a photoresist subsequent to a development can be increased or decreased by controlling the amount of the base used at this time, thus being achieved the present invention.

DISCLOSURE OF THE INVENTION

The present invention provides a process for forming a resist pattern, which increases the amount of reduction in thickness of a chemically amplified photoresist coating after development by 100 Å to 600 Å in comparison with the case of not applying the composition for preventing development-defects, comprising: a step of forming a chemically amplified photoresist coating on a substrate having a diameter of 8 inches or more by application; a step of applying a composition for preventing development-defects containing a surfactant on the chemically amplified photoresist coating; a step of baking after at least either the step of forming the chemically amplified photoresist coating by application or the step of applying the composition for preventing development-defects; a step of selectively exposing the chemically amplified photoresist coating; a step of post-exposure baking the chemically amplified photoresist coating; and a step of developing the chemically amplified photoresist coating, wherein said surfactant is at least one member selected from the group consisting of (1) an ammonium salt, a tetraalkylammonium salt or a $C_1$ to $C_4$ alkanolamine salt of $C_4$ to $C_{15}$ perfluoroalkylcarboxylic acid, (2) an ammonium salt, a tetraalkylammonium salt or a $C_1$ to $C_4$ alkanolamine salt of $C_4$ to $C_{10}$ perfluoroalkylsulfonic acid, (3) a quaternary ammonium salt of perfluoroadipic acid, and (4) a fluorinated alkyl quaternary ammonium salt of inorganic acid which is at least one member selected from the group consisting of sulfric acid, hydrochrolic acid, nitric acid and hydroiodic acid, at the same time said surfactant being one that is formed at the equivalent ratio of an acid to a base of 1:1-1:3.

The present invention also provides a composition for preventing development-defects which contains a surfactant and is used for the process of forming a resist pattern that increases the amount of reduction in thickness of a chemically amplified photoresist coating after development by 100 Å to 600 Å in comparison with the case of not applying the composition for preventing development-defects, comprising: a step of forming a chemically amplified photoresist coating on a substrate having a diameter of 8 inches or more by application; a step of applying a composition for preventing development-defects containing a surfactant on the chemically amplified photoresist coating; a step of baking after at least either the step of forming the chemically amplified photoresist coating by application or the step of applying the composition for preventing development-defects; a step of selectively exposing the chemically amplified photoresist coating; a step of post-exposure baking the chemically amplified photoresist coating; and a step of developing the chemically amplified photoresist coating, wherein said surfactant is at least one member selected from the group consisting of (1) an ammonium salt, a tetraalkylammonium salt or a $C_1$ to $C_4$ alkanolamine salt of $C_4$ to $C_{15}$ perfluoroalkylcarboxylic acid, (2) an ammonium salt, a tetraalkylammonium salt or a $C_1$ to $C_4$ alkanolamine salt of $C_4$ to $C_{10}$ perfluoroalkylsulfonic acid, (3) a quaternary ammonium salt of perfluoroadipic acid, and (4) a fluorinated alkyl quaternary ammonium salt of inorganic acid which is at least one member selected from the group consisting of sulfric acid, hydrochrolic acid, nitric acid and hydroiodic acid, at the same time said surfactant being one that is formed at the equivalent ratio of acid to base of 1:1-1:3.

CONCRETE MODE OF THE INVENTION

The present invention is described in more detail below. In a resist pattern forming process of the present invention, the amount of reduction in thickness of the chemically amplified photoresist coating after development is made bigger by 100 Å to 600 Å in comparison with the case of not applying the composition for preventing development-defects on the chemically amplified photoresist coating. In order to make the amount of reduction in thickness of photoresist film after developing treatment big in amount, when forming the surfactant described in above items (1) to (4) which is contained in the composition for preventing development-defects, an equivalent quantity of base is made excessive to that of acid in the present invention.

As an organic acid which is used upon forming surfactants (1) to (3) described above which are contained in the composition for preventing development-defects, there are exemplified preferably functional fluorocarbon compounds, particularly perfluoroalkylcarboxylic acid such as $C_4$ to $C_{15}$ perfluoroalkylcarboxylic acid, perfluoroalkylsulfonic acid such as $C_4$ to $C_{10}$ perfluoroalkylsulfonic acid, and perfluoroadipic acid. As a base, there are exemplified ammonia, amines and quaternary ammonium alkyl hydroxide and ammonia, tetramethylammonium hydroxide and $C_1$ to $C_4$ alkanolamine are particularly preferred. The organic acid and the base such as amine, quaternary ammonium alkyl hydroxide or ammonia are mixed in an aqueous solution, and for example, an ammonium salt, a tetraalkylammonium salt such as a tetramethylammonium salt or an amine salt such as $C_1$ to $C_4$ alkanol amine salt, of an organic acid is formed. When forming an above-described surfactant (4), an inorganic acid such as sulfuric acid, hydrochloric acid, nitric acid, hydroiodic acid, and the like is used as the acid, and on the other side, fluorinated alkyl quaternary ammonium hydroxide etc. is used as the base.

In the present invention, these surfactants are formed by solving the determined amount of the acid and the base in water. At this time, the amount of the formed surfactant in the aqueous solution is made 0.1 to 25 weight-%, more preferably 2 to 4 weight-%. The aqueous solution is used as a composition for reducing development defects. If necessary, additives are further solved in this aqueous solution and the resulting solution may be used as a composition for preventing development-defects. In addition, the surfactant-containing aqueous solution may be formed by adjusting the concentration, for example, by adding the preformed high concentration aqueous surfactant to water containing additives if necessary or vise versa by diluting the preformed high concentration aqueous surfactant with an additive-containing aqueous solution if necessary.

In this situation, the amount of reduction in thickness of the resist layer can be optimized by properly adjusting the mixing ratio of the above-described acid and base such as an amine, a quaternary ammonium hydroxide, and ammonia to adjust basicity of the composition in consideration of the kind of a chemically amplified photoresist to be used or processing conditions. It means that, upon forming a surfactant, a mixing amount of the acid and the base is controlled as that the equivalent of a base is excessive to the equivalent of an acid in the present invention. At this time, the amount of reduction in film thickness after development of photoresist is increased by increasing the amount of base to be used. Accordingly the amount of reduction in film thickness upon developing resist can be controlled to obtain an optimized result by properly adjusting the mixing ratio of the acid to the base such as an amine, a quaternary ammonium hydroxide, and ammonia in accordance with the kind of a chemically amplified photoresist to be used or processing conditions. In the composition for preventing development-defects to be applied for positive-working chemically amplified photoresist, the ratio of acid to base, for example amine, is usually 1:1 to 1:3, preferably 1:1 to 1:2 in equivalent ratio.

In the composition for preventing development defects of the present invention, a water-soluble resin and a various kinds of additives can be formulated within the limit wherein its performance is not damaged, if necessary.

As a water-soluble resin which is used for the composition for preventing development defects of the present invention, there can be illustrated, for examples, poly(vinyl alcohol), poly(acrylic acid), poly(vinylpyrrolidone), poly($\alpha$-trifuluoromethyl acrylic acid), poly(vinyl methyl ether-co-maleic anhydride), poly(ethylene glycol-co-propylene glycol), poly(N-vinylpyrrolidone-co-vinyl acetate), poly(N-vinylpyrrolidone-co-vinyl alcohol), poly(N-vinylpyrrolidone-co-acrylic acid), poly(N-vinylpyrrolidone-co-methyl acrylate), poly(N-vinylpyrrolidone-co-methacrylic acid), poly(N-vinylpyrrolidone-co-methyl methacrylate), poly(N-vinylpyrrolidone-co-maleic acid), poly(N-vinylpyrrolidone-co-dimethyl maleate), poly(N-vinylpyrrolidone-co-maleic anhydride), poly-(N-vinylpyrrolidone-co-itaconic acid), poly(N-vinylpyrrolidone-co-methyl itaconate), poly(N-vinylpyrrolidone-co-itaconic anhydride), fluorinated polyether, etc. Above all, poly(acrylic acid), poly(vinylpyrrolidone), and fluorinated polyether are especially preferred.

As the additives to be used in the composition for preventing development-defects of the present invention, there can be illustrated, for example, surfactants to be added for improving coating properties, such as nonionic surfactants, anionic surfactants and amphoteric surfactants. As the nonionic surfactants, there are exemplified polyoxyethylene alkyl ethers such as polyoxyethylene lauryl ether, polyoxyethylene oleyl ether and polyoxyethylene cetyl ether, polyoxyethylene fatty acid diesters, polyoxyfatty acid monoester, polyoxyethylene-polyoxypropylene block polymer, and acetylene glycol derivatives. As the anionic surfactants, there are exemplified ammonium salts or organic amine salts of alkyldiphenyl ether disulfonic acid, ammonium salts or organic amine salts of alkyldiphenyl ether sulfonic acid, ammonium salts or organic amine salts of alkylbenzenesulfonic acid, ammonium salts or organic amine salts of polyoxyethylene alkyl ether sulfuric acid, and ammonium salts or organic amine salts of alkyl sulfuric acid. As the amphoteric surfactants, there are exemplified 2-alkyl-N-carboxymethyl-N-hydroxyethyl-imidazolinium betaine and laurylamidopropyl hydroxysulfone betaine.

Further, as water to be used in the composition for preventing development-defects of the present invention, water from which organic impurities, metal ions, etc. have been removed by distillation, an ion-exchange treatment, a treatment through filter or various adsorption treatments are preferably illustrated.

Additionally, in order to improve coating properties, a water-soluble organic solvent can be used together with water. The water-soluble organic solvent is not particularly limited as long as it can be soluble in water in a concentration of 0.1 wt % or more. Examples of the organic solvent include alcohols such as methyl alcohol, ethyl alcohol and isopropyl alcohol, ketones such as acetone and methyl ethyl ketone, esters such as methyl acetate and ethyl acetate, and polar solvents such as dimethylformamide, dimethylsulfoxide, methyl cellosolve, cellosolve, butyl cellosolve, cellosolve acetate, butylcarbitol and carbitol acetate. These specific examples are merely illustrated as examples of the organic solvents, and the organic solvents to be used in the present invention are not limited only to these solvents.

In addition, optimization of the amount of reduction in thickness of the resist coating in the present invention may also be attained by properly adjusting baking time or baking temperature of the resist and the composition for preventing development-defects as well as optimization by the composition itself for reducing development defects. As to the prebaking temperature for the resist, there are generally two types in accordance with photoresist compositions to be used. That is, one type requires a high energy and generally requires to bake at a temperature of about 100° C. to about 150° C., and another type does not require so much energy in comparison with the former and requires to bake at a temperature of 100° C. or lower. In addition, prebaking temperature for the composition for preventing development-defects is generally 60° C. to 100° C. which is high enough to remove the solvent. Further, post-exposure baking of the resist is generally about 100° C. to about 150° C. For example, in the case where T-tops are formed after development, formation of such T-tops can be avoided in some cases by such combination of baking temperatures for the resist and the composition for preventing development-defects that resist-prebaking temperature is set at a lower level while prebaking temperature for the composition for preventing development-defects at a level of 100° C. or higher. In addition, too much reduction in thickness of the resist coating disadvantageous in an etching step can be avoided by optionally delaminating or dissolving away the composition for preventing development-defects after exposure.

Thickness of the coating of the composition for preventing development-defects in the present invention may be such that it provides enough chemical action to more reduce thickness of the resist coating in comparison with the case of not applying the composition for preventing development-defects. The thickness of the coating is preferably 80 Å to 10,000 Å, more preferably 330 Å to 990 Å. Coating of the composition for preventing development-defects can be conducted by any of known coating methods such as a spin coating method.

The chemically amplified photoresist to be used as a resist in the present invention may be any of known positive-working chemically amplified photoresists. As the positive-working chemically amplified photoresist, there are known a number of ones including that which is composed of a combination of a polymer wherein polyhydroxystyrene is protected with t-butoxycarbonyl group and a photo acid generator (see, H. Ito and C. G. Willson: Polym. Eng. Sci., 23, 1012 (1983)). Thickness of the coating may be such that a resist pattern obtained after development can suitably exert its performance during etching in the etching step, and is generally about 0.3 to 1.0 µm.

The pattern-forming method of the present invention can favorably be applied upon formation of a pattern on a substrate having a diameter of 8 inches or more. As the substrate, a silicon substrate is common, and of course may be those wherein a metal layer or an oxide or nitride layer such as silicon oxide, silicon nitride or silicon oxide nitride is formed on silicon. In addition, the substrate itself is not limited to silicon but may be any of substrate materials having so far been used for manufacturing IC such as LSI.

As to the method for coating the chemically amplified photoresist and baking of the chemically amplified photoresist layer and the layer of reducing development defect compositions, exposing method, developing agents, and developing methods, any ones or any conditions having so far been employed for forming a resist pattern using a chemically amplified photoresist may be employed. Further, as an exposing light source to be used in the exposing step, any of UV rays, deep UV rays, X rays and electron beams may be used.

BEST MODE FOR PRACTICING THE INVENTION

The present invention will now be described more specifically by reference to Examples which, however, are not to be construed to limit the present invention in any way.

EXAMPLE-1

1.3 parts by weight of polyacrylic acid having weight average molecular weight of 3,000 as determined by polystyrene standards as a water-soluble polymer, 2.0 parts by weight of perfluoro-octylic acid ($C_7F_{15}COOH$) as an organic acid, 0.46 parts by weight of tetramethylammonium hydroxide (TMAH) (equivalent ratio (mole) of organic acid and base is 1:1.04) as a base were mixed up. Pure water was added thereto to make the total amount 100 parts by weight. Then, the solution was solved homogeneously at room temperature, and filtered with a 0.1 μm-filter to obtain the composition for preventing development-defects.

On the other hand, a positive-working photoresist comprising acetal type polymer manufactured by Clariant (Japan) K.K. (AZ DX3301P, 'AZ' is a registered trade mark.) was applied on an 8 inches silicon wafer by a spin coater made by Tokyo Electron Co. (Mark 8). It was pre-baked on a hot plate at 90° C. for 90 seconds to form a photoresist film of 480 nm in thickness on a silicon wafer. The film thickness was measured by film thickness measuring equipment SM300 manufactured by Prometric Co.

Subsequently the above described composition for preventing development-defects was applied on the photoresist film by using the same spin coater as the above. It was then pre-baked on a hot plate at 90° C. for 60 seconds to form a film for preventing development-defects on a photoresist film of 450 Å in thickness. Next, exposure to light was conducted by using KrF reduced projection exposure equipment, FPA 3000-EX5, PEB was conducted on a hot plate at 110° C. for 60 seconds. Using alkali developer, AZ 300MIF Developer (2.38 weight % tetramethylammonium hydroxide aqueous solution; 'AZ' is a registered trademark.) as a developer, it was paddle-developed on the condition of 23° C. for 1 minute, to obtain a resist pattern having 1:1 line and space width. And also the film thickness after development was measured using the same equipment as one described above. The amount of film reduction in thickness was obtained by deducting the film thickness after development from one before development. The cross sectional form of the formed resist pattern was observed by Scanning Electronic Microscope (SEM). Observation result of the cross-sectional form of the resist pattern and the amount of film reduction in thickness are shown in the Table-1 described below.

EXAMPLES 2 to 5

The same manner was taken as in Example-1 except that the equivalent (mole) ratios of base were made as described in Table-1 below and the results in Table-1 were obtained.

TABLE 1

| | Film thickness before Development (Å) | Film thickness after Development (Å) | Reduction amount in film thickness (Å) | Organic Acid | Base | Pattern Profile |
| --- | --- | --- | --- | --- | --- | --- |
| Example-1 | 4819 | 4589 | 230 | 1 | 1.04 | almost rectangular |
| Example-2 | 4789 | 4460 | 329 | 1 | 1.25 | rectangular |
| Example-3 | 4796 | 4395 | 401 | 1 | 1.38 | rectangular |
| Example-4 | 4837 | 4379 | 458 | 1 | 1.52 | almost rectangular |
| Example-5 | 4809 | 4299 | 510 | 1 | 2.00 | almost rectangular |

COMPARATIVE EXAMPLE-1

In the same manner as in above described Example-1, the silicon wafer on which a positive-working chemically amplified photoresist was applied was prepared. Then, exposure to light, PEB and development were conducted in the same manner as in Example-1 except that the composition for preventing development-defects was not applied thereon and a pattern form of resist cross section was observed and the amount of reduction in film thickness was measured. The result is shown in Table-2 described below.

TABLE 2

| | Film thickness before Development Å | Film thickness after Development Å | Reduction amount in film thickness Å | Pattern Profile |
| --- | --- | --- | --- | --- |
| Comparative Example-1 | 4801 | 4698 | 103 | T-top |

COMPARATIVE EXAMPLE-2

Perfluorooctyl acid ($C_7F_{15}COOH$) was added into the composition used in the Example-1 described above, mixed up to be excessive by acid having 1:0.9 of molar ratio of acid to base. Pure water was added therein, followed by solving at room temperature homogeneously. Next, it was filtered through 0.1 μm filter to obtain the composition for preventing development-defects containing a surfactant having the almost same concentration as in Example-1. Treating in the same manner as in Example-1 except for using this composition for preventing development-defects, the result in Table-3 was obtained.

COMPARATIVE EXAMPLE-3

Treating in the same manner as in Comparative Example-1 except for making the molar ratio of perfluorooctylic acid and base 1:0.95, the result in Table-3 was obtained.

TABLE 3

|  | Film thickness before Development (Å) | Film thickness after Development (Å) | Reduction amount in film thickness (Å) | Acid | Base | Pattern Profile |
|---|---|---|---|---|---|---|
| Comparative Example-2 | 4820 | 4649 | 171 | 1 | 0.90 | T-top |
| Comparative Example-3 | 4805 | 4624 | 181 | 1 | 0.95 | T-top |

As being obvious from the results described in the above Table-1 and Table-2, it was confirmed that the reduction amount in film thickness is likely to increase as addition of a base and to decrease as addition of an acid. And then if these ratios of base to be added are made within a certain limit, the resist pattern profile to be formed can be greatly improved.

EFFECTS OF INVENTION

As described above in details, by using the composition for preventing development-defects of the present invention, T-top pattern form of a chemically amplified positive-working photoresist can be eliminated, for example, which is caused by PED or by intermixing with resist, and an excellent pattern profile can be made having no development-defects even in the substrate with a large diameter of 8 inches or more.

INDUSTRIAL APPLICABILITY

The process and composition for preventing development-defects of the present invention are the good resist pattern-forming method used upon forming a chemically amplified photoresist coating on a substrate with a large diameter and the composition for preventing development-defects used for the method.

The invention claimed is:

1. A process for forming a resist pattern, which increases the amount of reduction in thickness of a chemically amplified positive photoresist coating after development by 100 Å to 600 Å in comparison with the case of not applying the composition for preventing development-defects, comprising: a step of forming a chemically amplified positive photoresist coating on a substrate having a diameter of 8 inches or more by application; a step of applying a composition for preventing development-defects containing a surfactant on the chemically amplified positive photoresist coating; a step of baking after at least either the step of forming the chemically amplified positive photoresist coating by application or the step of applying the composition for preventing development-defects; a step of selectively exposing the chemically amplified positive photoresist coating; a step of post-exposure baking the chemically amplified positive photoresist coating; and a step of developing the chemically amplified positive photoresist coating, wherein said surfactant is at least one member selected from the group consisting of (1) a tetraalkylammonium salt of $C_4$ to $C_{15}$ perfluoroalkylcarboxylic acid and (2) a tetraalkylammonium salt of $C_4$ to $C_{10}$ perfluoroalkylsulfonic acid, at the same time said surfactant being one that is formed at the equivalent ratio of acid to base of 1:1.04-1:3, and further where the composition for preventing development-defects has an equivalent excess of base as compared to acid.

\* \* \* \* \*